United States Patent
Shirakawa

(10) Patent No.: US 8,547,726 B2
(45) Date of Patent: Oct. 1, 2013

(54) SEMICONDUCTOR MEMORY DEVICE AND CONTROLLING METHOD THEREOF

(75) Inventor: Masanobu Shirakawa, San Jose, CA (US)

(73) Assignee: Kabushiki Kaisha Toshiba, Tokyo (JP)

( * ) Notice: Subject to any disclaimer, the term of this patent is extended or adjusted under 35 U.S.C. 154(b) by 216 days.

(21) Appl. No.: 13/079,332

(22) Filed: Apr. 4, 2011

(65) Prior Publication Data

US 2012/0250393 A1   Oct. 4, 2012

(51) Int. Cl.
*G11C 11/00* (2006.01)

(52) U.S. Cl.
USPC .......................................................... 365/148

(58) Field of Classification Search
USPC .......................................................... 365/148
See application file for complete search history.

(56) References Cited

U.S. PATENT DOCUMENTS

| 2005/0195638 A1* | 9/2005 | Benzinger et al. ............ 365/149 |
| 2010/0046275 A1* | 2/2010 | Hosono et al. ................ 365/148 |
| 2011/0141793 A1* | 6/2011 | Kono ............................ 365/148 |

FOREIGN PATENT DOCUMENTS

JP    2010-80041    4/2010

* cited by examiner

*Primary Examiner* — Hoai V Ho
*Assistant Examiner* — Min Huang
(74) *Attorney, Agent, or Firm* — Oblon, Spivak, McClelland, Maier & Neustadt, L.L.P.

(57) ABSTRACT

According to one embodiment, a semiconductor memory device includes a memory cell array in which memory cells each including at least a rectification element and a variable resistance element, which are connected in series, a peripheral circuit, a sense amplifier configured to sense the memory cells via the peripheral circuit, and a control circuit configured to control operations of the memory cell array and the sense amplifier. The control circuit is configured to boost a potential of a selected bit line, which is one of a first even bit line and a first odd bit line of a first side, by charge sharing of a second even bit line and a second odd bit line which are nonselected bit lines and physically neighbor the first even bit line or the first odd bit line of the first side, which is connected to a selected one of the memory cells.

18 Claims, 12 Drawing Sheets

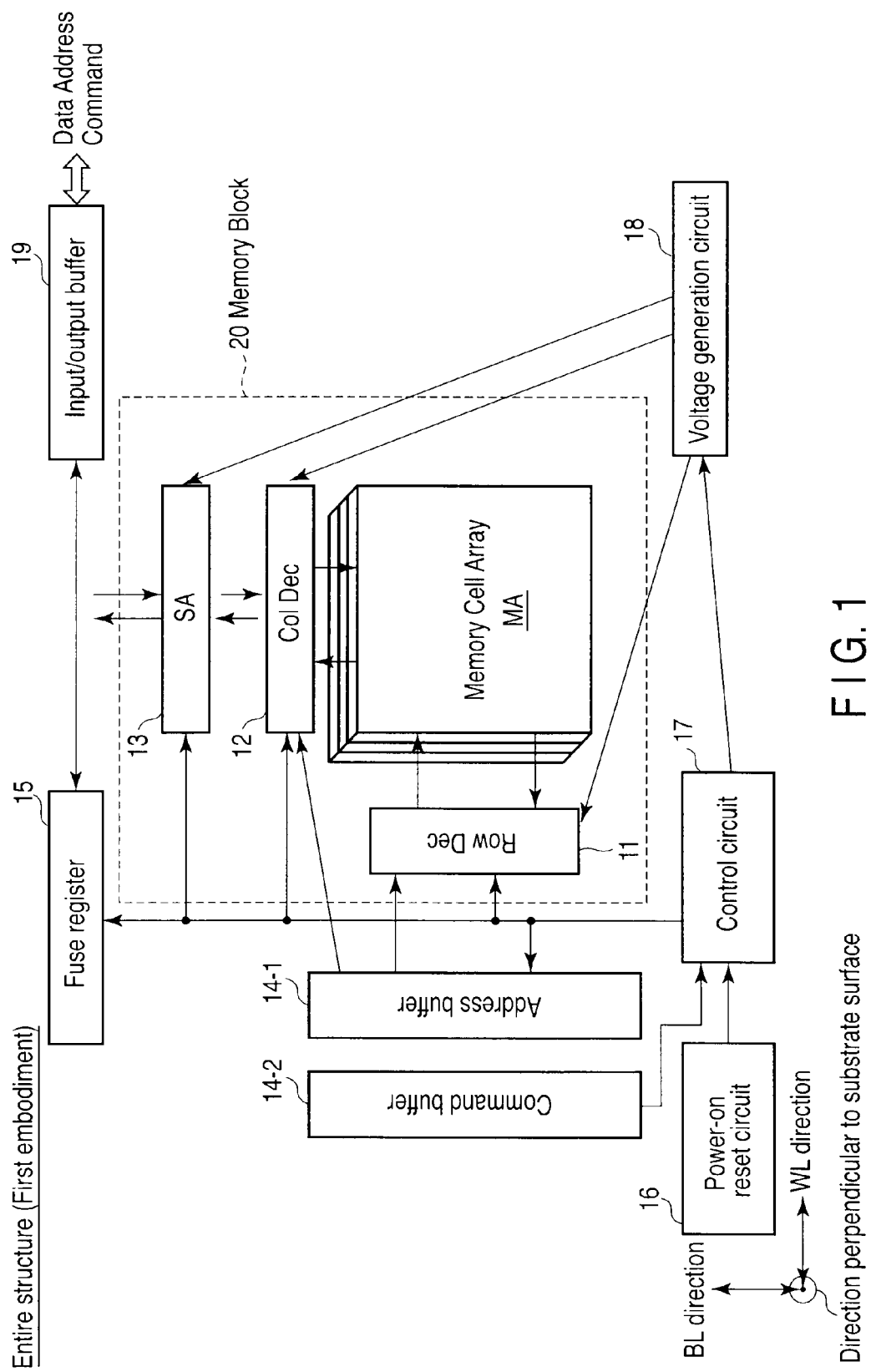
F I G. 1

3D Structure
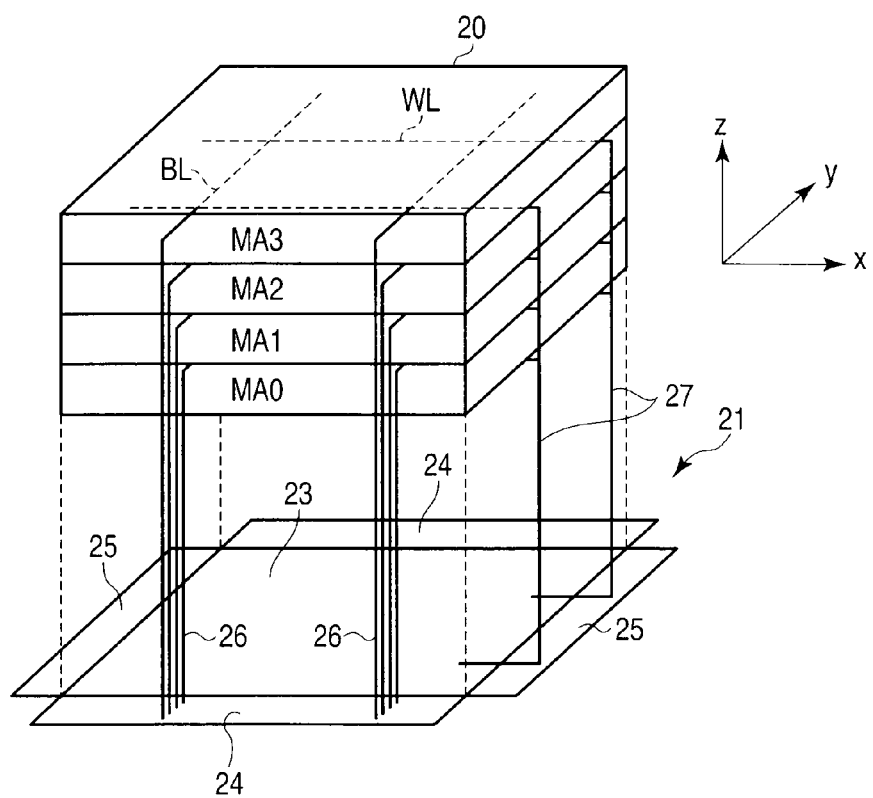
F I G. 2

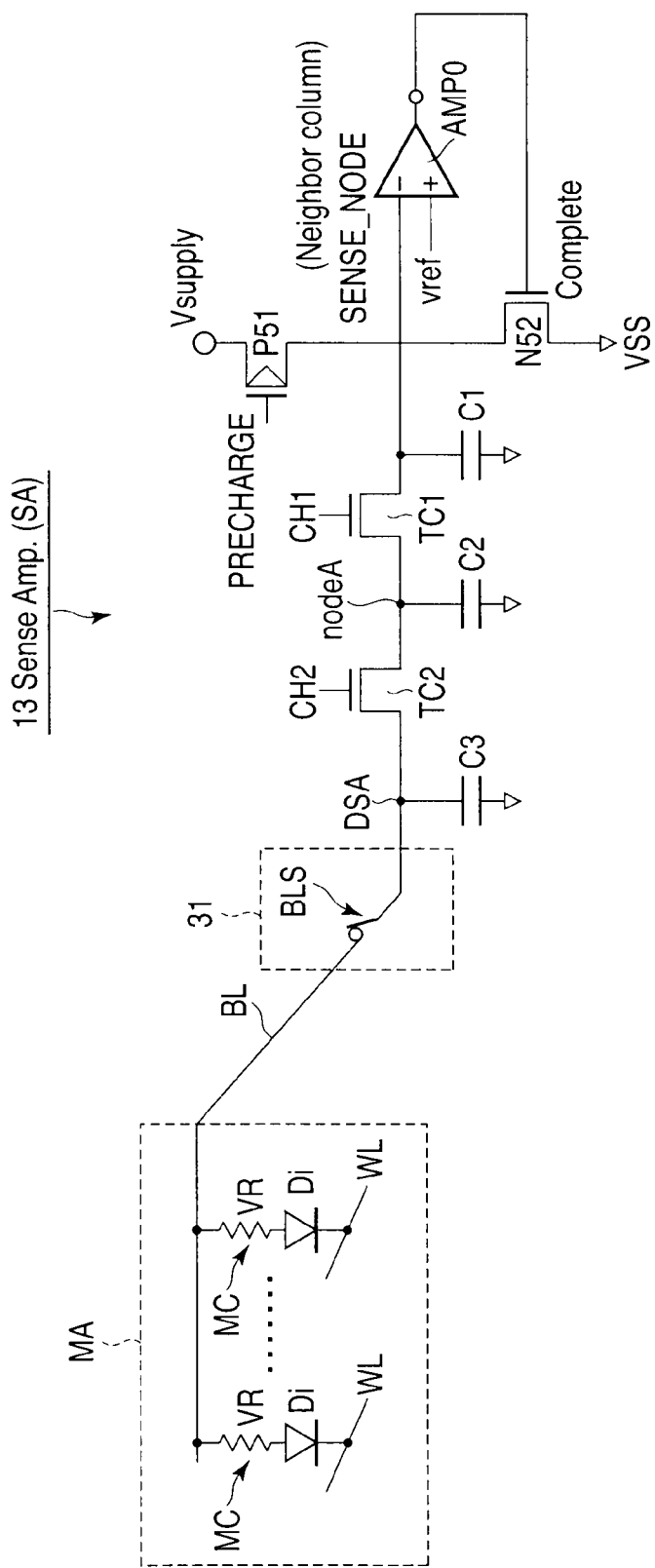
F I G. 5

BL Selecting operation (First embodiment)

|  | | First step (Left or Right) | Second step (even or odd) |
|---|---|---|---|
| Left side | even (BLle) | Nonselected | Nonselected |
| | odd (BLlo) | Nonselected | Nonselected |
| Right side | even (BLre) | Selected | Nonselected |
| | odd (BLro) | Selected | Selected |

F I G. 6A

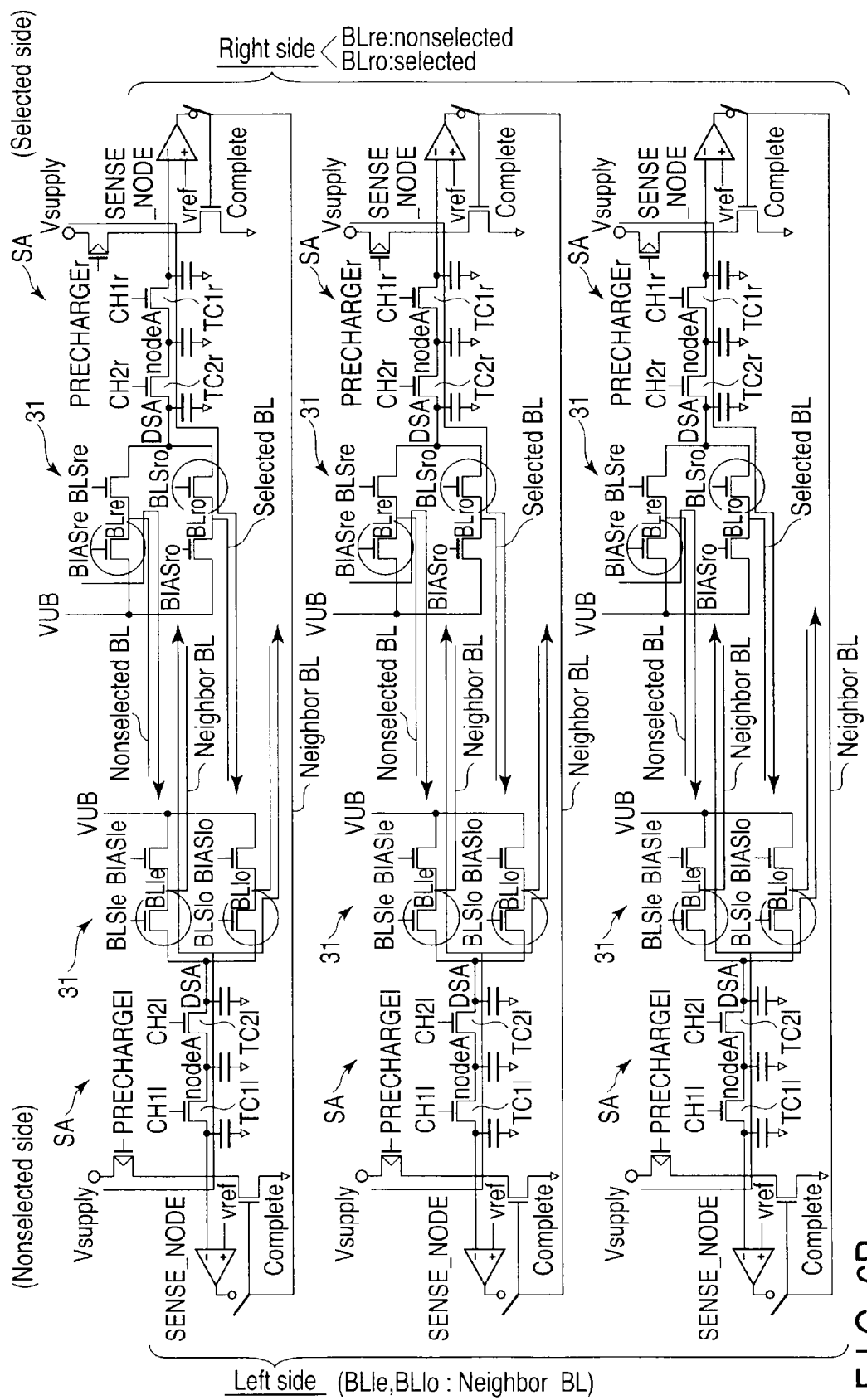
F I G. 6B

SEMICONDUCTOR MEMORY DEVICE AND CONTROLLING METHOD THEREOF

FIELD

Embodiments described herein relate generally to a semiconductor memory device and a controlling method thereof.

BACKGROUND

In recent years, attention has been paid to a resistive memory as a candidate for a successor to a flash memory. It is assumed that resistive memory devices include not only a resistive memory (ReRAM: Resistive RAM) in a narrow sense, in which a transition metal oxide is used as a recording layer and a resistance value state thereof is stored in a nonvolatile manner, but also a phase-change memory (PCRAM: Phase Change RAM) in which a chalcogenide or the like is used as a recording layer and resistance value information of its crystalline state (conductor) and noncrystalline state (insulator) is utilized.

It is known that a variable resistance element of the resistive memory has two operation modes. One of the two operation modes is called "bipolar mode" in which a high resistance state and a low resistance state are set by changing the polarity of application voltage. The other is called "unipolar mode" in which a high resistance state and a low resistance state can be set by controlling a voltage value and a voltage application time.

In order to realize a high-density memory cell array, the unipolar type is preferable. In the case of the unipolar type, a cell array can be constructed without using a transistor, by overlaying a variable resistance element and a rectification element, such as a diode, at an intersection between a bit line and a word line. Furthermore, by stacking such memory cell arrays in a three-dimensional fashion, a large capacity can be realized without increasing the cell array area.

In order to increase the integration density of memory cell arrays and to realize a low-cost memory chip, it is necessary to decrease the number of divisions of the memory cell array and to stack largest possible cell arrays as many as possible in the vertical direction. In this case, however, the distance between a peripheral circuit and the memory cell array increases, and such a case arises that a large parasitic capacitance occurs in the wiring between the bit line and the peripheral circuit. Such a large parasitic capacitance may become a cause of an erroneous write operation or an erroneous erase operation in the memory cell.

BRIEF DESCRIPTION OF THE DRAWINGS

FIG. 1 is a system block diagram showing a semiconductor memory device according to a first embodiment;

FIG. 2 is a view for describing a 3D structure of a memory block according to the first embodiment;

FIG. 5 is an equivalent circuit diagram showing a sense amplifier according to the first embodiment;

FIG. 6A is a view illustrating a sense operation of the semiconductor memory device according to the first embodiment;

FIG. 6B is an equivalent circuit diagram illustrating the sense operation of the semiconductor memory device according to the first embodiment;

DETAILED DESCRIPTION

Figure 3:
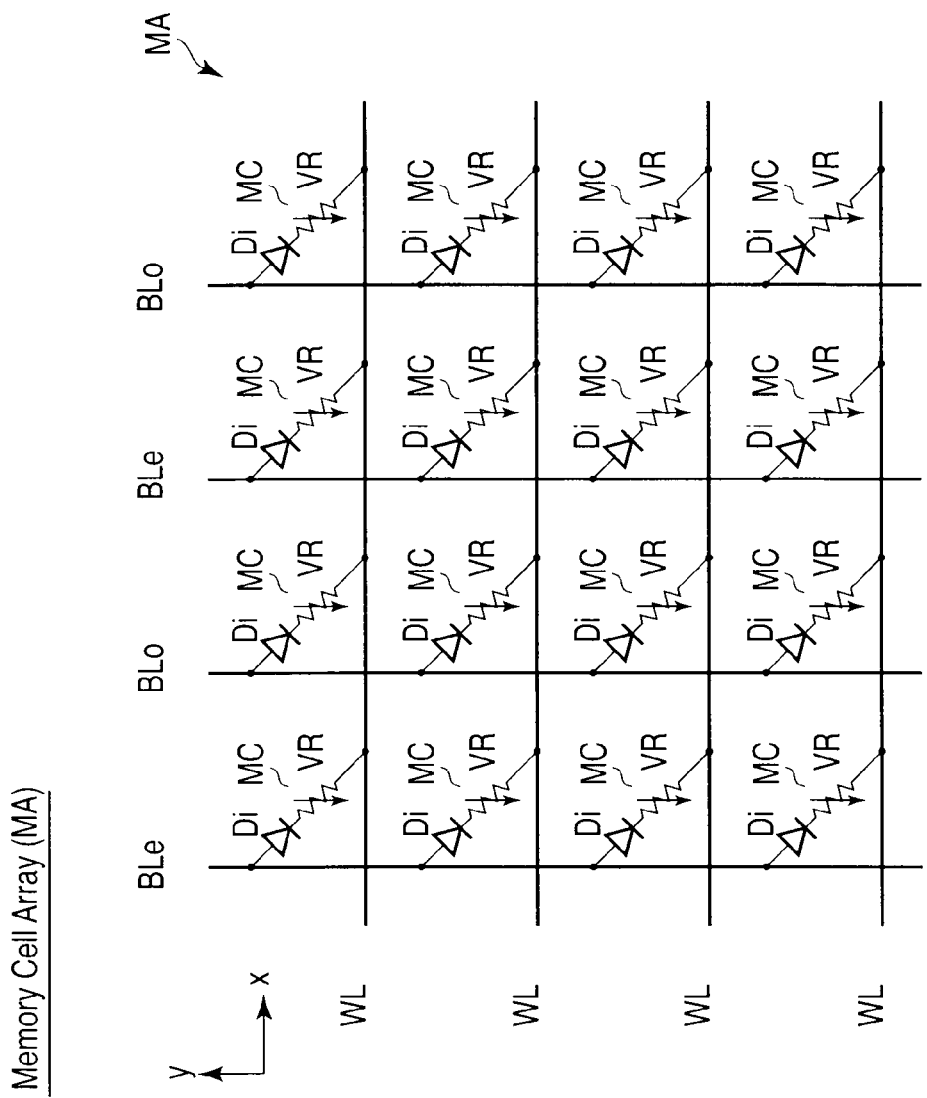
FIG. 3 is an equivalent circuit diagram showing a memory cell array according to the first embodiment.

In general, according to one embodiment, a semiconductor memory device includes a memory cell array in which memory cells each including at least a rectification element and a variable resistance element, which are connected in series, are disposed; a peripheral circuit including a first even bit line and a first odd bit line of a first side, and a second even bit line and a second odd bit line of a second side, which are electrically connected to the memory cells; a sense amplifier configured to sense the memory cells via the peripheral circuit; and a control circuit configured to control operations of the memory cell array and the sense amplifier. The control circuit is configured to boost a potential of a selected bit line, which is one of the first even bit line and the first odd bit line of the first side, by charge sharing of the second even bit line and the second odd bit line which are nonselected bit lines and physically neighbor the first even bit line or the first odd bit line of the first side, which is connected to a selected one of the memory cells.

Embodiment will now be described with reference to the accompanying drawings. In the embodiments, a description is given of, as an example of a semiconductor memory device, a resistance random access memory (ReRAM) having a 3D memory cell array structure in which memory cell arrays are stacked. This structure, however, is merely an example, and, needless to say, the embodiments are not limited to this structure. In the description below, common parts are denoted by like reference numerals throughout the drawings.

First Embodiment

1. Structure Example

1-1. Entire Structure Example

To begin with, referring to FIG. 1, a description is given of an entire structure example of a semiconductor memory device according to a first embodiment.

As shown in FIG. 1, the semiconductor memory device according to this embodiment comprises a memory block 20, an address buffer 14-1, a command buffer 14-2, a fuse register 15, a power-on reset circuit 16, a control circuit 17, a voltage generation circuit 18, and an input/output buffer 19.

The memory block (Memory Block) 20 comprises a memory cell array (Memory Cell Array) MA, a low decoder (Row Dec) 11, a column decoder (Col Dec) 12, and a sense amplifier (SA) 13.

The memory cell array MA includes a plurality of memory cells which are disposed in a matrix at intersections between a plurality of bit lines and a plurality of word lines. The memory cell array MA has a 3D structure in which a plurality of memory cell arrays MA are stacked in a direction perpendicular to the substrate surface of the semiconductor substrate, as will be described later.

The row decoder 11 decodes addresses of a row direction (WL line direction). The row decoder 11 includes a driving circuit (not shown) which drives word lines.

The column decoder 12 decodes addresses of a column direction (BL line direction). The column decoder 12 includes a driving circuit (not shown) which drives bit lines. In this example, although not shown, the column decoder 12 may be disposed on each of the upper side (Upper) and the lower side (Lower) of the memory cell array MA.

The sense amplifier (SA) 13 is electrically connected to the column decoder 12 and the bit lines, and reads data of the memory cells. The details of the sense amplifier 13 will be described later.

The address buffer 14-1 is electrically connected to the row decoder 11 and column decoder 12, and holds row addresses and column addresses.

The command buffer 14-2 is electrically connected to the control circuit 17, and holds control commands.

The fuse (Fuse) register 15 is electrically connected to the input/output buffer 19 via a data bus, etc., and holds necessary data such as management data.

The power-on reset circuit 16 detects power-on of the semiconductor memory device, and outputs a reset signal to the control circuit 17.

The voltage generation circuit 18 is electrically connected to the row decoder 11, column decoder 12 and sense amplifier 13, and supplies, under the control of the control circuit 19, necessary voltages to these circuit components.

The input/output buffer 19 is electrically connected to the sense amplifier 13 and fuse register 15 via the data bus, and holds data (Data), addresses (Address) and commands (Command) from the outside, for example, from a host apparatus.

The control circuit 17 controls the above-described circuit components. For example, the control circuit 17 controls the above-described circuit components, and executes a set operation, a reset operation, a read operation and a sensing operation, which will be described later.

1-2. Structure Example of Memory Block

Next, referring to FIG. 2, a description is given of an example of the 3D structure of the memory block 20 in FIG. 1.

As shown in FIG. 2, the memory block 20 according to the first embodiment comprises a plurality (four in this example) of memory cell array MA0 to MA3 which are stacked on a wiring area 23 on which wiring lines, such as a global bus, are formed, a bit line contact area 24 and a word line contact area 25.

The wiring area 23 is provided on a semiconductor substrate 21. A global bus, etc., for transferring data, which is written/read in/from the memory block 20, to/from the outside is provided on the wiring area 23. As will be described later, the column decoder 12, sense amplifier 13 and row decoder 11 may be disposed on the wiring area 23.

Vertical wiring lines (via contacts) need to be provided on the side surfaces of the memory block 20 in order to connect the word lines WL and bit lines BL of the stacked memory cell arrays MA and the wiring area 23 that is formed on the semiconductor substrate 21. The bit line contact areas 24 and word line contact areas 25 are provided on the four sides of the wiring area 23. Bit line contacts 26 and word line contacts 27 for connecting the bit lines BL and word lines WL and the control circuit, etc. are formed on the bit line contact areas 24 and word line contact areas 25.

One end of each word line WL is connected to the wiring area 23 via the word line contact 27 which is formed on the word line contact area 25. One end of each bit line BL is connected to the wiring area 23 via the bit line contact 26 which is formed on the bit line contact area 24.

In the structure illustrated, the single memory block 20 is configured such that the plural memory cell arrays MA0 to MA3 are stacked in the direction (z-direction) perpendicular to the semiconductor substrate 21. However, a plurality of such unit memory blocks 20 may be arranged in a matrix in the longitudinal direction (x-direction) of the word line WL and the longitudinal direction (y-direction) of the bit line BL.

In the present embodiment, in the word line contact area 25, the word lines WL of all layers in a cross section are connected to the wiring area 23 via a single contact, that is, a common contact. In the bit line contact area 24, the bit lines BL of the respective layers are connected to the wiring area 23 via individually provided four contacts. In this embodiment, the bit lines BL are independently driven in association with the respective layers, and the word lines WL are commonly connected in all layers. However, the word lines WL, too, may be independently driven in association with the respective layers. Besides, the bit lines BL may be commonly connected, and the word lines WL may be independently driven. Furthermore, at least either the bit lines BL or the word lines WL may be configured to be shared between the upper and lower layers.

1-3. Structure Example of Memory Cell Array

Next, referring to FIG. 3, a description is given of a circuit structure example of the memory cell array MA in FIG. 2.

As shown in FIG. 3, in the memory cell array MA, a plurality of unit memory cells MC are arranged in a two-dimensional matrix in the longitudinal direction (y-direction in FIG. 2) of the bit line BLe, BLo, and in the longitudinal direction (x-direction) of the word line WL.

In this manner, in the present example, the bit lines are distinguished between even-numbered (even) bit lines BLe and odd-numbered (odd) bit lines BLo. One sense amplifier 13 is disposed in association with two bit lines BLe and BLo.

A resistance-type unit memory cell MC, in which a rectification element, for instance, a diode D1, and a variable resistance element VR are connected in series, is disposed at an intersection between the word line WL and the bit line BLe, BLo. In the meantime, the arrangements and polarities of the diode D1 and variable resistance element VR, which constitute the memory cell MC, are not limited to those illustrated.

The variable resistance element VR has a structure of, e.g. an electrode/transition metal oxide/electrode. A variation is caused to occur in the resistance value of the metal oxide by application conditions of, e.g. voltage, current and heat, and different states of the resistance value are stored as information in a nonvolatile manner. Concrete examples of the variable resistance element VR include a variable resistance element in which a resistance value is changed by a phase transition between a crystalline state and a noncrystalline state of, e.g. chalcogenide (PCRAM); a variable resistance element in which a resistance value is changed by forming a contacting bridge between electrodes by precipitating metal cations, or by breaking the contacting bridge by ionizing a precipitated metal (CBRAM: Conductive Bridging RAM); and a variable resistance element in which a resistance value is changed by application of voltage or current (ReRAM) (generally classified into one in which a resistance variation occurs due to the presence/absence of a charge trapped in a charge trap which is present at an electrode interface, and one in which a resistance variation occurs due to the presence/absence of a conduction path due to, e.g. oxygen deficit).

For example, in the case of a unipolar-type ReRAM, data write in the memory cell MC is executed by applying a voltage of, e.g. 3.5 V (actually about 4.5 V when a voltage drop of diode D1 is included) and a current of about 10 nA to the variable resistance element VR for a time of about 10 ns to 100 ns. Thereby, the variable resistance element VR transitions from a high resistance state to a low resistance state. In the description below, the operation of causing the variable resistance element VR to transit from the high resistance state to the low resistance state is referred to as a set operation (Set).

On the other hand, data erase in the memory cell MC is executed by applying a voltage of 0.8 V (actually about 1.8 V when a voltage drop of diode D1 is included) and a current of about 1 μA to 10 μA to the variable resistance element VR, which is in the low resistance state after the set operation, for a time of about 500 ns to 2 μs. Thereby, the variable resistance element VR transitions from the low resistance state to the high resistance state. In the description below, the operation of causing the variable resistance element VR to transit from the low resistance state to the high resistance state is referred to as a reset operation (Reset).

In the memory cell MC, for example, the high resistance state is a stable state (reset state). In the case of storing two-value data, data write is executed by a set operation which changes the reset state to the low resistance state.

A read operation of the memory cell MC is executed by applying a voltage of 0.4 V (actually about 1.4 V when a voltage drop of diode D1 is included) to the variable resistance element VR and monitoring the current flowing via the variable resistance element VR by the sense amplifier 13. Thereby, it is determined whether the variable resistance element VR is in the low resistance state or high resistance state. In the case where one memory cell MC can retain two-bit data, the sense amplifier generates three different reference voltages and compares the reference voltages with a cell signal.

The details of the sensing operation will be described later.

1-4. Peripheral Circuit

Figure 4:
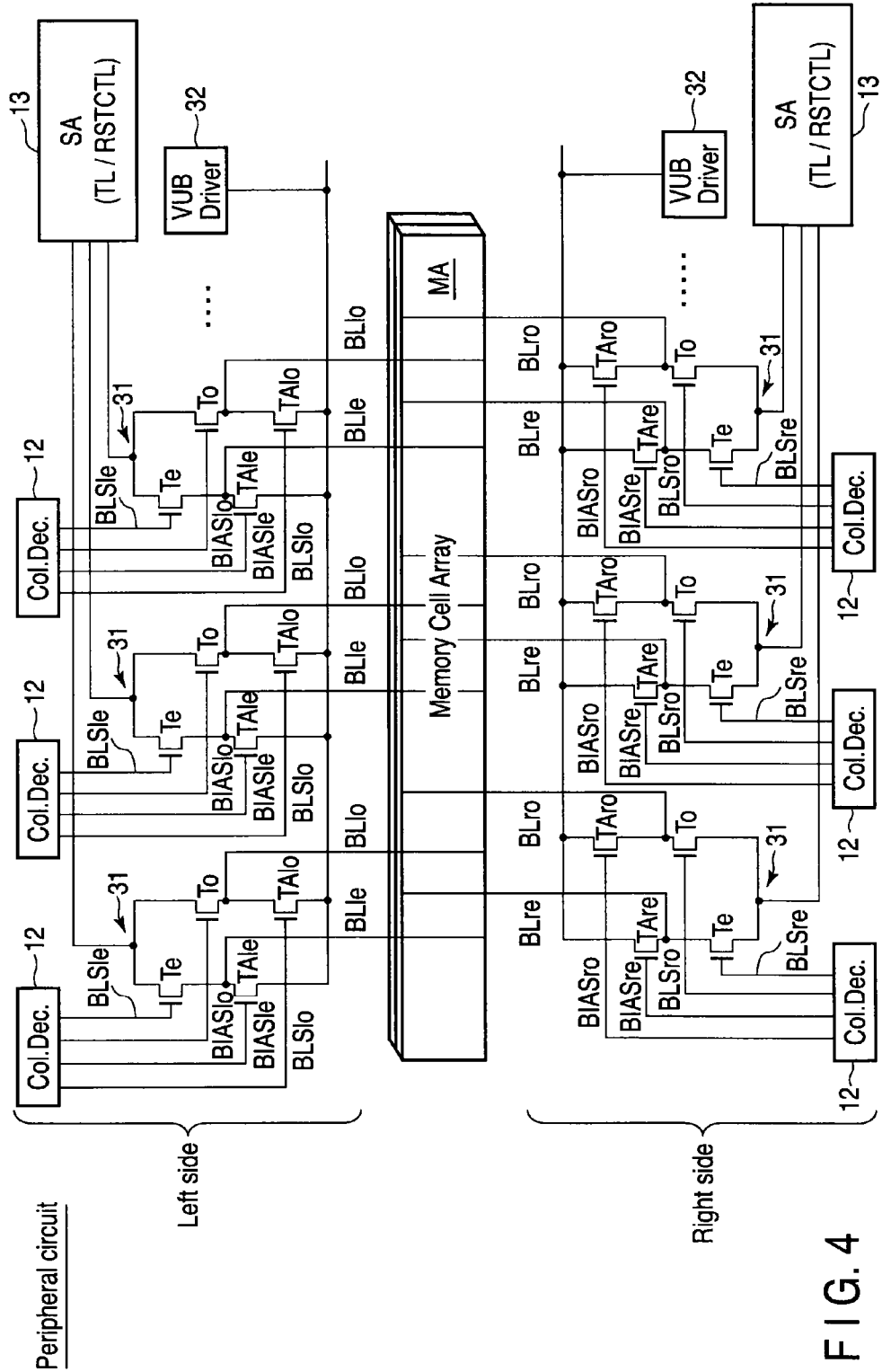
FIG. 4 is an equivalent circuit diagram for describing peripheral circuits of the memory block according to the first embodiment.

Next, referring to FIG. 4, a description is given of a circuit structure example of the peripheral circuit of the memory cell array MA. In order to reduce the area of occupation, it is preferable to dispose the peripheral circuit in the wiring area 23.

Although peripheral circuits in the column direction, which are electrically connected to the bit lines BLe and BLo, are illustrated, peripheral circuits in the row direction (e.g. row decoder 11), which are electrically connected to the word lines WL, are actually disposed.

As shown in FIG. 4, in the peripheral circuits relating to this embodiment, one sense amplifier 13 is disposed in association with two even/odd bit lines BLe and BLo, and a double-side (referred to as "right side/left side" in this example) driving configuration is adopted. Thus, even/odd bit lines (referred to as BLre and BLro) of the right side and even/odd bit lines (referred to as BLle and BLlo) of the left side are connected in the memory cell array MA.

Each of the right-side and left-side peripheral circuits comprises column decoders 12, a sense amplifier 13, a VUB driver 32, and even/odd select circuits 31.

The column decoder 12 decodes an address of the column direction (BL line direction), and outputs a select signal (BLSle, BLSre, BLSlo, BLSro, BIASle, BIASre, BIASlo, BIASro) to the even/odd select circuit 31.

The sense amplifier (SA (TL/RSTCTL)) 13 senses readout data of the memory cell which is selected by the even/odd select circuit 31.

The VUB driver 32 drives a predetermined reference voltage VUB.

The even/odd select circuit 31 receives the select signal from the column decoder 12 and selects the corresponding sense data and effects switching to the sense amplifier 13. The even/odd select circuit 31 includes four select transistors (Te, To, TAle (TAre), TAlo (TAro)).

One end of the current path of the transistor Te is connected to the bit line BLe, the other end of the current path of the transistor Te is connected to the sense amplifier 13, and the select signal BLSe from the column decoder 12 is input to the gate of the transistor Te. One end of the current path of the transistor TAle is connected to the bit line BLe, the other end of the current path of the transistor TAle is connected to the VUB driver 32, and the select signal BIASe from the column decoder 12 is input to the gate of the transistor TAle. One end of the current path of the transistor To is connected to the bit line BLo, the other end of the current path of the transistor To is connected to the sense amplifier 13, and the select signal BIASo from the column decoder 12 is input to the gate of the transistor To. One end of the current path of the transistor TAlo is connected to the bit line BLlo, the other end of the current path of the transistor TAlo is connected to the VUB driver 32, and the select signal BLSo from the column decoder 12 is input to the gate of the transistor TAlo. The same applies to the transistors TAre and TAro.

1-5. Structure Example of the Sense Amplifier

Next, referring to FIG. 5, a circuit structure example of the sense amplifier (SA) 13 is described.

As shown in FIG. 5, the sense amplifier 13 comprises transistors TC1, TC2, P51 and N52, capacitors C1, C2 and C3, and a differential amplifier AMP0.

Each of the transistors TC1 and TC2 transfers a charge by charge sharing. One end of the current path of the transistor TC2 is connected to the bit line via a node DSA, the other end of the current path of the transistor TC2 is connected to a node nodeA, and a signal CH2 is input to the gate of the transistor TC2. One end of the current path of the transistor TC1 is connected to the node nodeA, the other end of the current path of the transistor TC1 is connected to an inverted (−) input terminal (SENSE_NODE) of the differential amplifier AMP0, and a signal CH1 is input to the gate of the transistor TC1.

One end of the current path of the P-type transistor 51 is connected to a reference power supply voltage Vsupply, and a precharge signal (PRECHARGE) is input to the gate of the P-type transistor 51. One end of the current path of the N-type transistor 52 is connected to the other end of the current path of the P-type transistor P51, the other end of the current path of the N-type transistor 52 is connected to a ground power supply voltage VSS, and a detection signal (Complete), which is an output of the differential amplifier AMP0, is input to the gate of the N-type transistor N52.

One electrode of the capacitor C3 is connected to the ground power supply voltage VSS, and the other electrode of the capacitor C1 is connected to the node DSA. One electrode of the capacitor C2 is connected to the ground power supply voltage VSS, and the other electrode of the capacitor C1 is connected to the node nodeA. One electrode of the capacitor C1 is connected to the ground power supply voltage VSS, and the other electrode of the capacitor C1 is connected to the (−) input terminal (SENSE_NODE) of the differential amplifier AMP0.

The differential amplifier AMP0 amplifies a signal which is input to the (−) input terminal (SENSE_NODE) that is compared with a reference potential vref, and outputs the amplified signal as a detection signal (Complete).

1-6. Select Operation

As regards the structure of the above-described peripheral circuit, the select operation is described with reference to FIG. 6A and FIG. 6B.

The select operation is performed in two steps.

As shown in FIG. 6A, in the first step, the left side or right side is selected. The case is now assumed, by way of example, in which the right side has been selected.

Subsequently, in the second step, "even" or "odd" of the bit line is selected on the selected right side. The case is now assumed, by way of example, in which the odd side is selected (BLro: selected) and the even side is not selected (BLre: unselected).

In this case, as shown in FIG. 6B, when the odd-side bit line BLro is selected on the right side that is the selected side and the even-side bit line BLre is unselected, each of the select signal BLSo and BIASe is at "High" level.

Thereby, the selected bit line BLro is connected to the SENSE_NODE via transistors TC1r and TC2r in FIG. 6B, and a nonselected bit line voltage VUB is applied to the nonselected bit line BLre.

On the other hand, on the left side that is the nonselected side, each of select signals BLSe and BLSo is at "High" level. At this time, the same control is executed on the even-side and odd-side bit lines which are connected to the same sense amplifier 13 of the left side.

If attention is paid to the right-side bit line BLro that is the selected bit line, voltage is applied to both neighbor bit lines thereof via the select signal BLSe/BLSo from the nonselected left side.

Since the bit lines, which are driven from the nonselected side, are driven via the sense amplifier section, specific control can be executed.

In addition, bit lines, which are located at ±2 of the selected bit line, are nonselected bit lines of the selected side, and the voltage VUB that is the voltage of the nonselected BL is applied to these bit lines.

The details of the sense operation will be described later.

2. Operation

2-1. Set, Reset, Read

Figure 7:
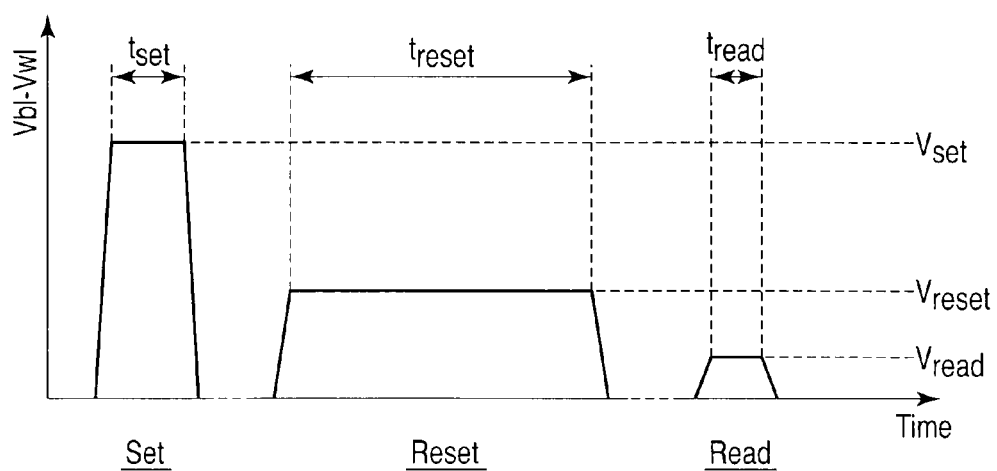
FIG. 7 is a view for explaining set, reset and read operations of the semiconductor memory device according to the first embodiment.

Next, referring to FIG. 7, the set, reset and read operations in this embodiment are described in brief.

(Set)

To begin with, the data write operation (Set) of the memory cell is described in brief.

Data write is executed by applying a voltage to the variable resistance element VR of the selected memory cell, and letting an electric current flow in the selected variable resistance element VR by causing a potential gradient therein.

For example, such a state is created that the potential of the word line WL is relatively lower than the potential of the bit line BL. As shown in FIG. 7, for example, a ground potential is applied to the word line WL during a time $t_{set}$, and a write voltage (Vset) is applied to the bit line BL.

At the time of this data write operation, it is preferable to apply a bias to the nonselected word line WL and nonselected bit line BL, thereby to prevent erroneous write, erroneous erase or a useless current path. In addition, at the time of standby prior to the data write operation, it is preferable to precharge all word lines WL and all bit lines BL. Besides, the application voltage for information recording may be generated by creating a state in which the potential of the bit line BL is relatively higher than the potential of the word line WL.

(Reset)

A data erase operation (Reset) is executed by Joule-heating the selected variable resistance element VR by current pulses, and promoting an oxidation-reduction reaction in the variable resistance element VR.

For example, as shown in FIG. 7, an erase voltage (Vreset) is applied between the word line WL and bit line BL during a time $t_{reset}$.

(Read)

A data read operation (Read) is executed, for example, by applying a voltage pulse to the selected variable resistance element VR and detecting a current, which is determined by the resistance of the memory cell, by the sense amplifier 13. It is preferable to set the amplitude of the voltage pulse at such a small level as not to cause a state change of the material which constitutes the variable resistance element VR. The read voltage is applied to the selected memory cell from the bit line BL, and the current value at that time is measured by the sense amplifier SA.

For example, as shown in FIG. 7, a read voltage (Vread) is applied from the bit line BL to the selected memory cell during a time $t_{read}$.

As has been described above, in the present embodiment, the following relationship is established: time $t_{read}$<time $t_{set}$<time $t_{reset}$, and write voltage Vset>erase voltage Vreset>read voltage Vread. However, the relationship is not limited to this, and may be varied where necessary.

2-2. Sensing Operation

Next, the sensing operation in the present embodiment is described with reference to a timing chart of FIG. 8.

Figure 8:
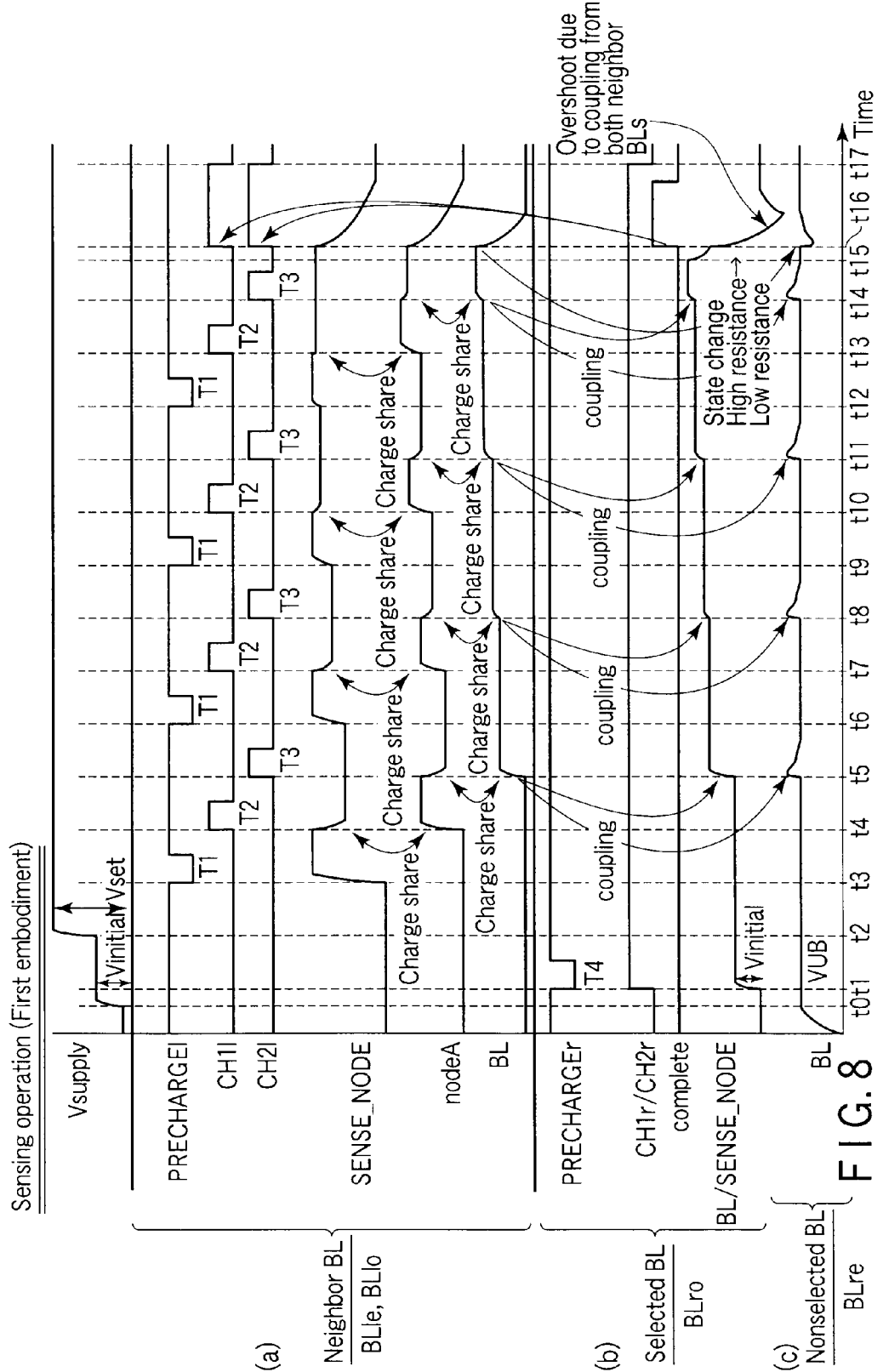
FIG. 8 is a timing chart for describing a sense amplifier in the sense operation according to the first embodiment.

In this description, the relationship of selection, as shown in FIG. 6A and FIG. 6B, is taken as an example. in FIG. 8, symbol (a) indicates the bit line (BLle, BLlo) which is driven from the nonselected left side, symbol (b) indicates a selected bit line, that is, an odd-side selected bit line BLro which is driven from the right side, and symbol (c) is a nonselected bit line BLre of the nonselected side.

2-2-1. Neighbor Bit Line BLle, BLlo (Neighbor BL): Bit Line Driven from the Nonselected Side To begin with, a description is given of the operation of the sense amplifier circuit SA which is connected to the nonselected bit lines BLle, BLlo (Neighbor BL), which neighbor on both sides of the select bit line BLro and are driven from the nonselected side.

At set operation start time t0, the power supply Vsupply is set at Vinitial that is an initial charge voltage of the selected bit line BLe.

Subsequently, at time t1, a signal PRECHARGEr is set at "L" level during period T4, and the selected bit line BLro is charged at Vinitial, as described later.

Subsequently, at time t2, the power supply Vsupply is set at a set voltage Vset. The voltage Vset alone is not high enough to set a voltage which is necessary for the set operation. In the case where the selected memory cell MC is already in a set state and there is no need to apply a pulse, 0 V or VUB (nonselected bit line voltage) is applied to the node DSA.

Then, at time t3, a PRECHARGEl signal is set at "Low" level during a period T1, and the sense node SENSE_NODE of the sense amplifier SA of the neighbor column is charged at Vset.

Subsequently, at time t4, a charge share signal CH1 between the sense node SENSE_NODE and the node nodeA is set at "High" level during a period T2, and charge sharing (Charge share) is executed between the sense node SENSE_NODE and the node nodeA.

Subsequently, at time t5, a charge share signal CH2 between the node nodeA and node DSA is set at "High" level during a period T3, and charge sharing (Charge share) is executed between the node nodeA and node DSA.

In this case, since the bit line select switch BLS is at "H" level, the (a) bit line (Neighbor BL) BLle, BLlo, which is driven from the nonselected side, rises to a potential equal to the node DSA.

In addition, the potential of the (b) selected bit line (Selected BL) BLro rises by a coupling effect (Coupling) due to the increase in potential of the neighbor bit line BLle, BLlo.

The above-described cycle of time t3 to time t5 is repeated until a state change detection signal "complete" of the cell of the selected column, which will be described later, reaches the "High" level.

By repeating this cycle, the potential of the bit line BLle, BLlo, which is driven by the nonselected side, can be boosted to Vset at maximum, while the floating state is maintained.

2-2-2. (b) Selected Bit Line BLro (Selected BL): Selected Side

Next, the operation of the sense amplifier circuit SA, which is connected to the selected BLro, is described.

To start with, at time t1, the PRECHARGEr signal is set at "Low" level during a period T4. At this time, since the power supply Vsupply is the initial voltage Vinitial, the sense node SENSE_NODE of the sense amplifier SA of the selected column is charged at the initial voltage Vinitial.

At time t1, both signals CH1 and CH2 are at "High" level, the selected BLro is also charged to the initial voltage Vinitial via the sense node SENSE_NODE.

Subsequently, after the PRECHARGEr signal is restored to "High" level, the BL/DSA/nodeA/SENSE_NODE are all set in the floating state at the same potential, and are kept in the floating state until the end of data write.

Thereafter, the potential of the selected bit line BLro is boosted by repeating the above-described coupling effect (Coupling) by the charge sharing (Charge share) due to the (a) nonselected neighbor bit lines BLle, BLlo.

Then, at time t15, if the selected memory cell MC has changed from the high resistance state to the low resistance state, a current flows through the selected memory cell MC, and the charge of the BL/DSA/nodeA/SENSE_NODE decreases.

Subsequently, at time t16, if the differential amplifier AMP0 in the sense amplifier SA detects the decrease in potential of the sense node SENSE_NODE of the selected sense amplifier SA, the output "complete" is inverted to "High". A time lag occurs between time t15 at which the actual state change occurs and time t16 at which the decrease in potential is detected. Preferably, the time lag should be as short as possible, from the standpoint of preventing an erroneous reset ("set after erroneous reset") by which a memory cell in which set is completed is reset once again.

The "set after erroneous reset" is described below.

At time of "set", since the cell changes from the high resistance state to the low resistance state in the state in which the set voltage is applied to the memory cell MC, an electric current flows in the cell. If this current exceeds a predetermined quantity, a state change would occur once again from the low resistance state to the high resistance state by Joule heat due to the current flowing through the cell. In order to prevent the "set after erroneous reset", it is desirable to lower the "set" voltage, to decrease the parasitic capacitance of the bit line, or to decrease the amount of charge flowing through the cell by discharging the potential of the bit line as soon as possible after the state change is detected.

At time t16, by the potential inversion of the detection signal "complete", the NMOS transistor N52 is turned on for discharging the sense node SENSE_NODE of the sense amplifier SA of the selected column and the sense node SENSE_NODE of the sense amplifier SA of each of both neighbor columns.

In addition, by controlling the CH1/CH2 signals of both neighbor columns (a) at "High" level, the BL/DSA/nodeA/SENSE_NODE is discharged to the same potential (e.g. ground level (or forward voltage Vf (~ about 0.6 V or less))).

By this control, not only by directly discharging the potential of the selected BLro to the ground power supply voltage VSS, but by the coupling due to the decrease in potential of both neighbor nonselected bit lines BLle and BLlo, the discharge speed of the selected bit line BLro can advantageously be increased. Furthermore, since the charge passing through the cell can be more decreased as the discharge speed becomes higher, the risk of erroneous reset ("set after erroneous reset"), by which a memory cell in which set is completed is reset once again, can advantageously be decreased.

According to the present embodiment, the erroneous reset, by which the memory cell in which set is completed is reset once again, can advantageously be prevented.

For example, in the case of the large-capacity memory structure in which a plurality of memories MAT are disposed, the wiring length of the peripheral circuit tends to become longer, and the parasitic capacitance occurring in the wiring of the peripheral circuit increases. In the present embodiment, by executing the above operation, even in the case where the parasitic capacitance is large, the erroneous operation can be prevented and the increase in capacity can advantageously be achieved.

In addition, in the present embodiment, before the voltage boost by the coupling (time t1), the initial voltage Vinitial (<Vset) is applied as an offset voltage to the selected bit line BLro. Therefore, the speed of the data write operation (set) of the memory cell MC can advantageously be increased.

As shown in part (c) of FIG. 8, during this time period, the nonselected bit line BLre of the selected side is fixed at voltage VUB by the signal BIASre.

3. Advantageous Effects

According to the first embodiment, at least the following advantageous effects (1) to (3) can be obtained.

(1) The speed of the sense operation can be increased and the erroneous reset can be prevented.

The semiconductor memory device according to this embodiment comprises a memory cell array MA in which memory cells MC each including at least a rectification element Di and a variable resistance element VR, which are connected in series, are disposed; a peripheral circuit including a first even bit line and a first odd bit line (BLle, BLlo) of a first side, and a second even bit line and a second odd bit line (BLre, BLro) of a second side, which are electrically connected to the memory cells; a sense amplifier 13 (SA) which senses the memory cells via the peripheral circuit; and a control circuit 17 which controls operations of the memory cell array MA and the sense amplifier 13.

In the above-described structure, the potential of the selected bit line BLro is increased (time t15) by repeating the coupling effect (Coupling) by the charge sharing (Charge share) of the second even and second odd bit lines of the nonselected second side (BLle and BLlo of the left side in this embodiment) which physically neighbor the first even or first odd bit line connected to the selected memory cell (odd bit line BLro of the right side in this example).

Therefore, the speed of the sense operation can advantageously be increased.

Furthermore, at the time of discharge, not only by directly discharging the potential of the selected BLro to the ground power supply voltage VSS, but also by the coupling due to the decrease in potential of both neighbor nonselected bit lines BLle and BLlo, the discharge speed of the selected BLro can advantageously be increased.

Since the charge passing through the cell can be more decreased as the discharge speed becomes higher, the risk of erroneous reset ("set after erroneous reset"), by which a memory cell in which set is completed is reset once again, can advantageously be decreased.

(2) The increase in capacity can advantageously be achieved.

For example, in the case of the large-capacity memory structure in which a plurality of memories MAT are disposed, the wiring length of the peripheral circuit tends to become longer, and the parasitic capacitance occurring in the wiring of the peripheral circuit increases. In the present embodiment, by executing the above operation, even in the case where the parasitic capacitance is large, the erroneous operation can be prevented and the increase in capacity can advantageously be achieved.

(3) The speed of the data write operation (set) can advantageously be increased.

In addition, in the present embodiment, before the voltage boost by the coupling (time t1), the initial voltage Vinitial (<Vset) is applied as an offset voltage to the selected bit line BLro. Therefore, the speed of the data write operation (set) of the memory cell MC can advantageously be increased.

Second Embodiment

An Example in which an Offset Voltage is Applied During Step-Up

Figure 9:
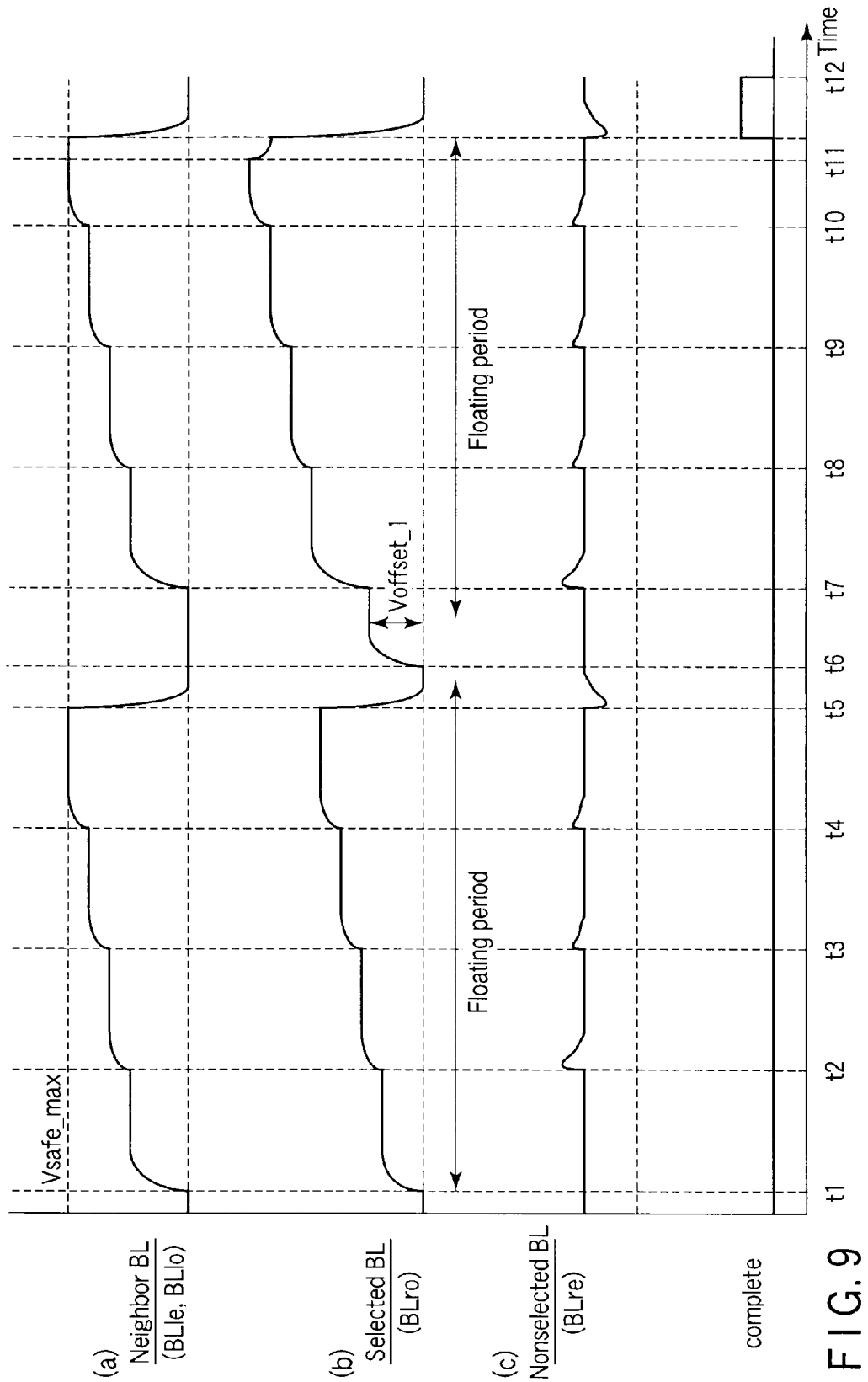
FIG. 9 is a timing chart illustrating a sense operation of a semiconductor memory device according to a second embodiment.

Next, referring to FIG. 9, a description is given of a semiconductor memory device according to a second embodiment and a controlling method thereof. This embodiment relates to an example in which an offset voltage Voffset is applied during step-up write. In the description below, a detailed description of the parts common to those in the first embodiment is omitted.

<Sensing Operation>

Referring to a timing chart of FIG. 9, a sensing operation according to the second embodiment is described. Like the above-described embodiment, the relationship of selection, as shown in FIG. 6A and FIG. 6B, is taken as an example. In FIG. 9, symbol (a) indicates the bit line (BLle, BLlo) which is driven from the nonselected left side, symbol (b) indicates a selected bit line, that is, an odd-side selected bit line BLro which is driven from the right side, and symbol (c) is a nonselected bit line BLre which is driven from the selected right side.

As shown in FIG. 9, in this example, at time t0, an offset voltage is not applied to the selected bit line BLro, and the same step-up write as described above is started.

Then, at time t6, control to apply an offset voltage Voffset to the selected bit line BLro is executed during the step-up write, and in this respect the second embodiment differs from the first embodiment.

At this time, the neighbor BL (BLle, BLlo) is discharged to 0 V in order to increase the coupling effect.

Subsequently, at time t7, the voltage of the neighbor BL (BLle, BLlo) is similarly stepped up in the state in which the offset voltage Voffset is applied to the selected bit line BLro. Thus, the selected bit line BLro is boosted up to (Voffset+Ccoupling) voltage.

Following the above, the same operation is executed, and the sensing operation of the second embodiment is finished.

Preferably, the timing of applying the offset voltage Voffset should be at a time when the voltage of the neighbor bit line BLle, BLlo has approached Vsafe_max. The Vsafe_max is a voltage which does not depend on the state of the memory cell MC, and which is permitted to be applied to the bit line. If a voltage higher than Vsafe_max is applied, breakdown occurs and erroneous write may possibly occur in the memory cell MC.

Although the set operation is described in this embodiment, it is also necessary in the reset operation or forming operation to quickly draw the BL voltage after the change of state. Thus, the application of the embodiment to these operations is effective. Moreover, this embodiment is similarly effective in the case of applying a voltage from the word line WL side.

Advantageous Effects

According to the second embodiment, at least the above-described advantageous effects (1) to (3) can be obtained.

Furthermore, the second embodiment differs from the first embodiment in that the control to apply the offset voltage Voffset to the selected bit line BLro is executed during the step-up write (time t6).

By executing the control to apply the offset voltage Voffset to the selected bit line BLro, the write time can be decreased and the speed of the operation can advantageously be increased.

The second embodiment is applicable where necessary.

Third Embodiment

An Example in which Nonselected Bit Lines are Independently Controlled

Figure 10:
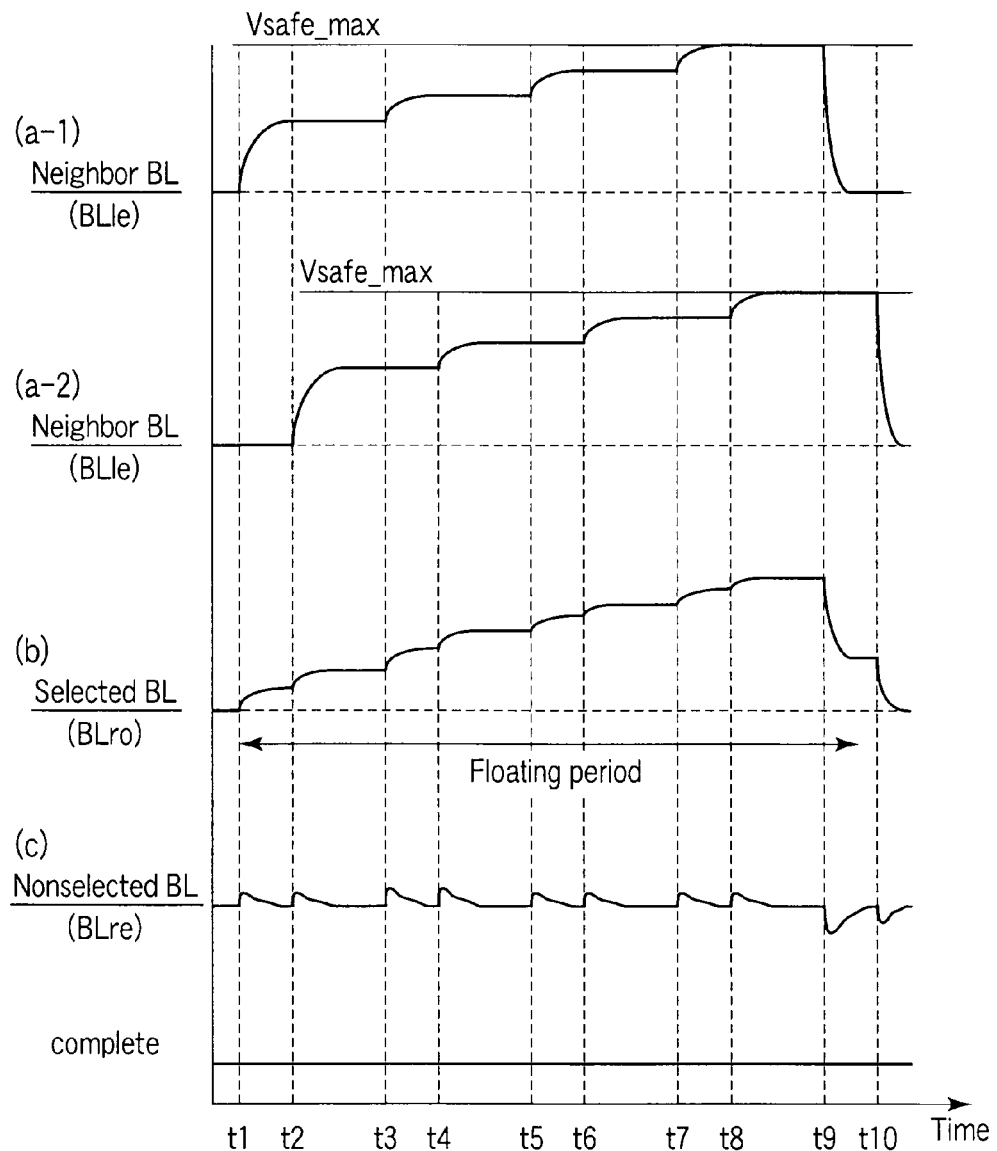
FIG. 10 is a timing chart illustrating a sense operation of a semiconductor memory device according to a third embodiment.

Next, referring to FIG. 10, a description is given of a semiconductor memory device according to a third embodiment and a controlling method thereof. This embodiment relates to an example in which nonselected bit lines, which neighbor a selected bit line, are independently controlled. In the description below, a detailed description of the parts common to those in the first embodiment is omitted.

<Sensing Operation>

Referring to a timing chart of FIG. 10, a sensing operation according to the third embodiment is described. Like the above-described embodiment, the relationship of selection, as shown in FIG. 6A and FIG. 6B, is taken as an example. In FIG. 10, symbol (a) indicates the bit line (BLle, BLlo) which is driven from the nonselected left side, symbol (b) indicates a selected bit line, that is, an odd-side selected bit line BLro which is driven from the right side, and symbol (c) is a nonselected bit line BLre which is driven from the selected right side.

As shown in (a-1) and (a-2) of FIG. 10, the third embodiment differs from the first embodiment in that the two nonselected bit lines BLle and BLlo, which neighbor the selected bit line BLro, are independently controlled.

For example, at time t1, one nonselected bit line BLle (n−1) is boosted, and the selected bit line BLro is boosted by the coupling effect.

Subsequently, at time t2, the other nonselected bit line BLlo (n+1) is boosted, and the selected bit line BLro is further boosted by the coupling effect.

Thereafter, the same control operation is executed.

Advantageous Effects

According to the third embodiment, at least the above-described advantageous effects (1) to (3) can be obtained.

Furthermore, the third embodiment differs from the first embodiment in that the control circuit 17 independently controls the two nonselected bit lines BLle and BLlo so that an offset occurs between the timings of the charge or discharge of the two nonselected bit lines BLle and BLlo.

Depending on the resistive material of the variable resistance element VR, there is a case in which an instantaneous high electric field is important in the write operation. In this case, as in the present embodiment, the two nonselected bit lines BLle and BLlo are independently controlled so that an offset is provided between the timings of charging the two nonselected bit lines BLle and BLlo, and thereby a high electric field can instantaneously be applied to the selected bit line BLro.

In this case, by setting the offset time (Toffset) at an optimal value, it becomes possible to start the discharge of the voltage of the nonselected bit line BLre at the time point when the electric field has increased to the maximum. Thus, the discharge of the selected bit line BLro can be started earlier than the detection of the state change, and the discharge can advantageously be executed at a higher speed.

Although the set operation is described in this embodiment, it is also necessary in the reset operation or forming operation to quickly draw the bit line voltage after the change of state. Thus, the application of the embodiment to these operations is effective. Moreover, this embodiment is similarly effective in the case of applying a voltage from the word line WL side.

Fourth Embodiment

Variation

Figure 11:
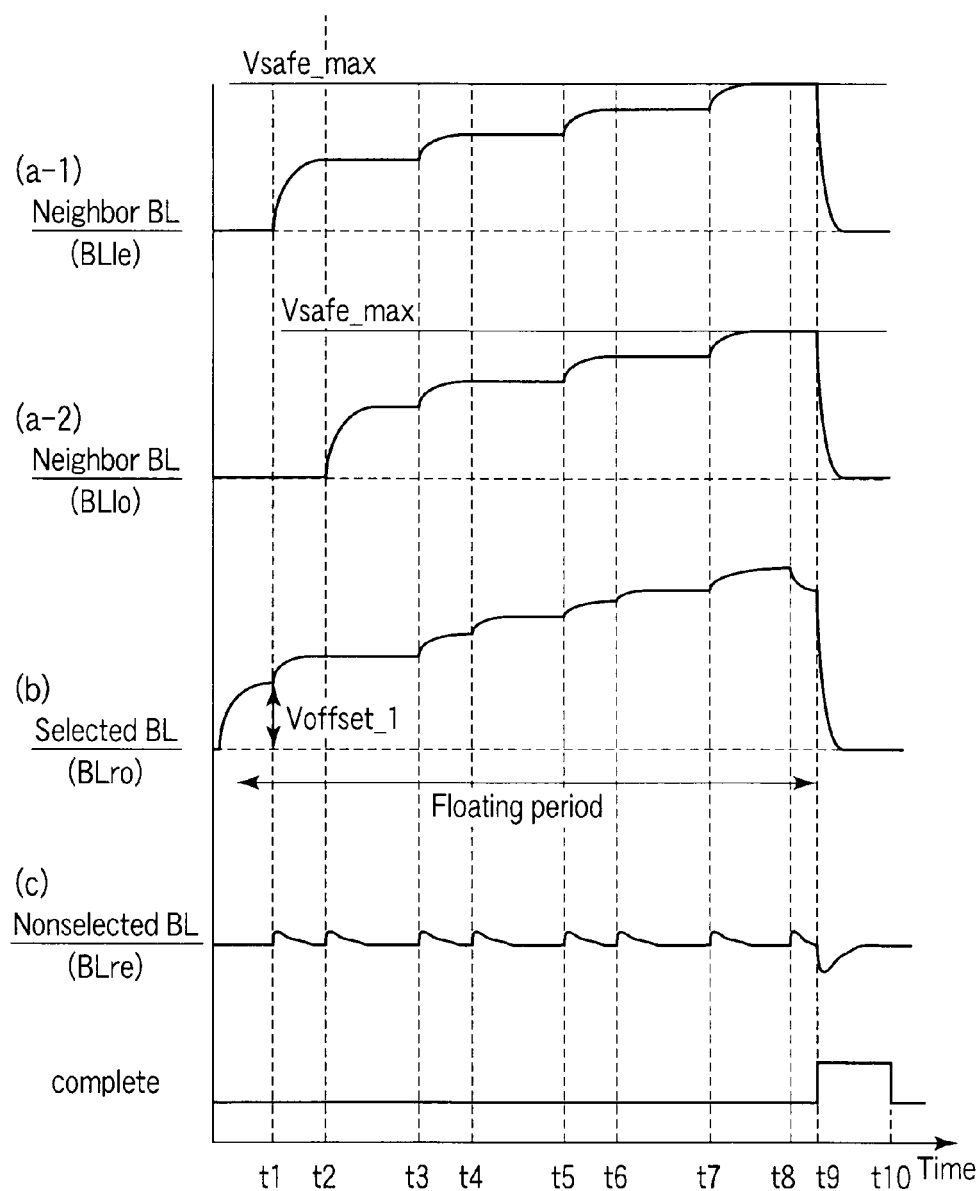
FIG. 11 is a timing chart illustrating a sense operation of a semiconductor memory device according to a fourth embodiment.

Next, referring to FIG. 11, a description is given of a semiconductor memory device according to a fourth embodiment and a controlling method thereof. This embodiment relates to an example of a variation of the control according to the above-described embodiment. In the description below, a detailed description of the parts common to those in the first embodiment is omitted.

<Sensing Operation>

Referring to a timing chart of FIG. 11, a sensing operation according to the fourth embodiment is described. Like the above-described embodiment, the relationship of selection, as shown in FIG. 6A and FIG. 6B, is taken as an example. In FIG. 11, symbol (a) indicates the bit line (BLle, BLlo) which is driven from the nonselected left side, symbol (b) indicates a selected bit line, that is, an odd-side selected bit line BLro which is driven from the right side, and symbol (c) is a nonselected bit line BLre which is driven from the selected right side.

As shown in FIG. 11, in the fourth embodiment, at time t1, an initial voltage Voffset1 is applied as an offset voltage to the selected bit line BLro.

At time t1, one nonselected bit line BLle is boosted, and the selected bit line BLro is boosted by the coupling effect.

Subsequently, at time t2, the other nonselected bit line BLlo is boosted, and the selected bit line BLro is further boosted by the coupling effect.

Thereafter, the same control operation is executed.

Advantageous Effects

According to the fourth embodiment, at least the above-described advantageous effects (1) to (3) can be obtained.

According to the present embodiment, the selected bit line BLro can advantageously be boosted to a higher level than in the case of the third embodiment. The variation as in this embodiment is applicable where necessary.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a memory cell array in which memory cells each including at least a rectification element and a variable resistance element, which are connected in series, are disposed;
   a peripheral circuit including a first even bit line and a first odd bit line of a first side, and a second even bit line and a second odd bit line of a second side, which are electrically connected to the memory cells;
   a sense amplifier configured to sense the memory cells via the peripheral circuit; and
   a control circuit configured to control operations of the memory cell array and the sense amplifier,
   wherein a potential of a selected bit line, which is one of the first even bit line and the first odd bit line of the first side, is boosted by charge sharing of the second even bit line and the second odd bit line which are nonselected bit lines and physically neighbor the first even bit line or the first odd bit line of the first side, which is connected to a selected one of the memory cells, and
   the control circuit is configured to independently control the two nonselected bit lines by providing an offset between timings of discharging the nonselected bit lines.

2. The device of claim 1, wherein one said sense amplifier is disposed in association with the first even bit line or the first odd bit line of the first side, and
   one said sense amplifier is disposed in association with the second even bit line or the second odd bit line of the second side.

3. The device of claim 2, wherein the peripheral circuit further includes:
   a column decoder configured to decode an address of a column direction of the memory cell array; and a select circuit configured to receive a select signal from the column decoder and to select corresponding sense data and effect switching to the sense amplifier.

4. The device of claim 1, wherein the sense amplifier further includes:
   a differential amplifier having an inverted input terminal electrically connected to the memory cell array; and
   a first transistor of a first conductivity type with a current path having one end connected to a first power supply voltage and having a control terminal connected to an output of the differential amplifier.

5. The device of claim 4, wherein the sense amplifier further includes:
   a capacitor having one electrode connected to the first power supply voltage and having the other electrode connected to the inverted input terminal of the differential amplifier; and
   a second transistor with a current path having one end and the other end connected between the memory cell array and the inverted input terminal of the differential amplifier, the second transistor being configured to transfer a charge of the capacitor by charge sharing.

6. The device of claim 4, wherein the current path of the first transistor is rendered conductive by potential inversion of an output signal of the differential amplifier, thereby discharging a charge of the selected bit line to the first power supply voltage.

7. The device of claim 1, wherein the control circuit is configured to further execute control to apply an offset voltage to the selected bit line.

8. The device of claim 7, wherein a timing at which the control circuit applies the offset voltage is at a beginning of, or in a course of, a data rewrite operation.

9. The device of claim 1, wherein the control circuit is configured to independently control the two nonselected bit lines by providing an offset between timings of charging the nonselected bit lines.

10. A controlling method of a semiconductor memory device comprising a memory cell array in which memory cells each including at least a rectification element and a variable resistance element, which are connected in series, are disposed; a peripheral circuit including a first even bit line and a first odd bit line of a first side, and a second even bit line and a second odd bit line of a second side, which are electrically connected to the memory cells; a sense amplifier configured to sense the memory cells via the peripheral circuit; and a control circuit configured to control operations of the memory cell array and the sense amplifier, the control method comprising:
   boosting a potential of a selected bit line, which is one of the first even bit line and the first odd bit line of the first side, by charge sharing of the second even bit line and the second odd bit line which are nonselected bit lines and physically neighbor the first even bit line or the first odd bit line of the first side, which is connected to a selected one of the memory cells, and
   independently controlling the two nonselected bit lines by providing an offset between timings of discharging the nonselected bit lines.

11. The method of claim 10, further comprising applying an offset voltage to the selected bit line.

12. The method of claim 11, wherein a timing of applying the offset voltage is at a beginning of, or in a course of, a data rewrite operation.

13. The method of claim 10, further comprising independently controlling the two nonselected bit lines by providing an offset between timings of charging the nonselected bit lines.

14. The method of claim 10, wherein one said sense amplifier is disposed in association with the first even bit line or the first odd bit line of the first side, and
   one said sense amplifier is disposed in association with the second even bit line or the second odd bit line of the second side.

15. The method of claim 14, wherein the peripheral circuit further includes:
   a column decoder configured to decode an address of a column direction of the memory cell array; and
   a select circuit configured to receive a select signal from the column decoder and to select corresponding sense data and effect switching to the sense amplifier.

16. The method of claim 14, wherein the sense amplifier further includes:
   a differential amplifier having an inverted input terminal electrically connected to the memory cell array; and
   a first transistor of a first conductivity type with a current path having one end connected to a first power supply voltage and having a control terminal connected to an output of the differential amplifier.

17. The method of claim 16, wherein the sense amplifier further includes:
   a capacitor having one electrode connected to the first power supply voltage and having the other electrode connected to the inverted input terminal of the differential amplifier; and
   a second transistor with a current path having one end and the other end connected between the memory cell array and the inverted input terminal of the differential amplifier, the second transistor being configured to transfer a charge of the capacitor by charge sharing.

18. The method of claim 16, wherein the semiconductor memory device is configured such that the current path of the first transistor is rendered conductive by potential inversion of an output signal of the differential amplifier, thereby discharging a charge of the selected bit line to the first power supply voltage.

* * * * *